US009087573B2

(12) United States Patent
Koyama

(10) Patent No.: US 9,087,573 B2
(45) Date of Patent: Jul. 21, 2015

(54) MEMORY DEVICE AND DRIVING METHOD THEREOF

(71) Applicant: Semiconductor Energy Laboratory Co., Ltd., Atsugi-shi, Kanagawa-ken (JP)

(72) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 121 days.

(21) Appl. No.: 13/787,867

(22) Filed: Mar. 7, 2013

(65) Prior Publication Data

US 2013/0242639 A1    Sep. 19, 2013

(30) Foreign Application Priority Data

Mar. 13, 2012   (JP) ................. 2012-056282

(51) Int. Cl.
| | |
|---|---|
| G11C 11/00 | (2006.01) |
| G11C 13/00 | (2006.01) |
| G11C 7/00 | (2006.01) |
| G11C 14/00 | (2006.01) |

(52) U.S. Cl.
CPC .............. *G11C 13/0002* (2013.01); *G11C 7/00* (2013.01); *G11C 14/009* (2013.01); *G11C 13/0007* (2013.01); *G11C 13/0069* (2013.01)

(58) Field of Classification Search
CPC ..................... G11C 13/0069; G11C 13/0004
USPC .......................................... 365/148, 163, 158
See application file for complete search history.

(56) References Cited

U.S. PATENT DOCUMENTS

| | | | |
|---|---|---|---|
| 6,531,371 B2 | 3/2003 | Hsu et al. | |
| 7,760,539 B2 | 7/2010 | Katoh | |
| 7,826,247 B2 | 11/2010 | Muraoka et al. | |
| 7,916,516 B2 | 3/2011 | Wei et al. | |
| 7,948,789 B2 | 5/2011 | Muraoka et al. | |
| 7,990,754 B2 | 8/2011 | Azuma et al. | |
| 8,102,696 B2 | 1/2012 | Katoh et al. | |
| 8,125,817 B2 | 2/2012 | Takagi et al. | |
| 8,279,657 B2 | 10/2012 | Takagi et al. | |
| 8,305,795 B2 | 11/2012 | Azuma et al. | |
| 8,320,159 B2 | 11/2012 | Wei et al. | |
| 2006/0081962 A1 | 4/2006 | Wei et al. | |
| 2010/0046273 A1 | 2/2010 | Azuma et al. | |
| 2010/0046287 A1* | 2/2010 | Widjaja | ........................ 365/163 |
| 2011/0110144 A1 | 5/2011 | Kawai et al. | |
| 2011/0121878 A1 | 5/2011 | Kato et al. | |
| 2011/0148463 A1 | 6/2011 | Kato et al. | |
| 2011/0249486 A1 | 10/2011 | Azuma et al. | |

(Continued)

FOREIGN PATENT DOCUMENTS

WO    2009/136442 A1    11/2009

*Primary Examiner* — Huan Hoang
(74) *Attorney, Agent, or Firm* — Fish & Richardson P.C.

(57) ABSTRACT

Even in a circuit which always needs power supply, with a structure in which power supply is stopped in a period which does not need power supply, power consumption at the time of writing data to a memory device included in the circuit is reduced. A volatile memory portion and a nonvolatile memory portion are provided in the memory device included in the circuit which always needs power supply. As a memory element for storing data stored in the volatile memory portion which is included in the nonvolatile memory portion, a variable resistance memory element whose resistance value can be varied depending on voltage applied between both end terminals thereof is used.

12 Claims, 12 Drawing Sheets

(56) References Cited

U.S. PATENT DOCUMENTS

| | | |
|---|---|---|
| 2012/0170355 A1 | 7/2012 | Ohmaru et al. |
| 2012/0195115 A1 | 8/2012 | Fujita et al. |
| 2012/0195122 A1 | 8/2012 | Ohmaru |
| 2012/0206956 A1 | 8/2012 | Fujita |
| 2012/0230078 A1 | 9/2012 | Fujita |
| 2012/0230138 A1 | 9/2012 | Endo |
| 2012/0243340 A1 | 9/2012 | Kobayashi et al. |
| 2012/0250407 A1 | 10/2012 | Kurokawa |
| 2012/0257439 A1 | 10/2012 | Kurokawa |
| 2012/0257440 A1 | 10/2012 | Takemura |
| 2012/0262982 A1 | 10/2012 | Takemura |
| 2012/0269013 A1 | 10/2012 | Matsuzaki |
| 2012/0271984 A1 | 10/2012 | Ohmaru et al. |
| 2012/0274361 A1 | 11/2012 | Miyake |
| 2012/0274378 A1 | 11/2012 | Fujita |
| 2012/0274379 A1 | 11/2012 | Yoneda et al. |
| 2012/0294069 A1 | 11/2012 | Ohmaru et al. |
| 2012/0314512 A1 | 12/2012 | Kurokawa |

* cited by examiner

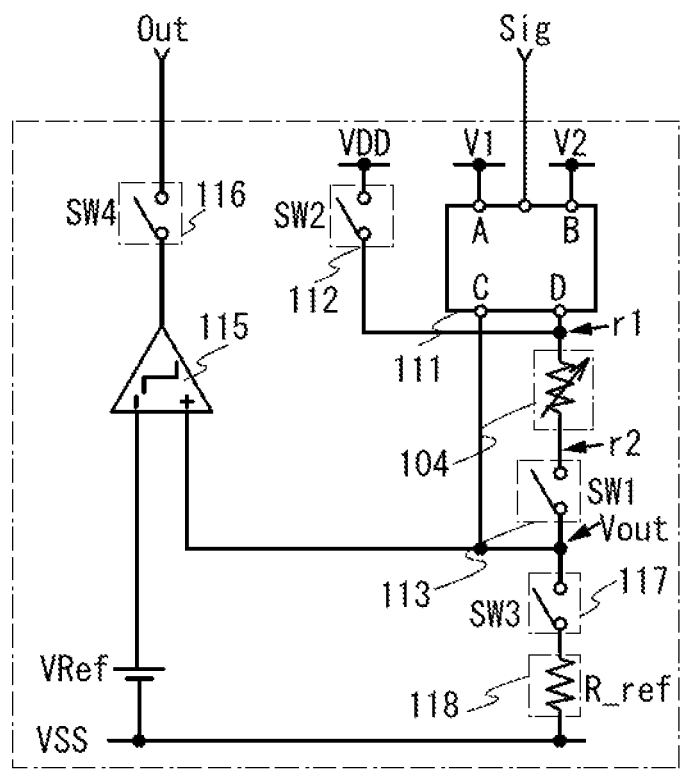

201 202

211 212

221 222

231 232

MEMORY DEVICE AND DRIVING METHOD THEREOF

BACKGROUND OF THE INVENTION

1. Field of the Invention

The present invention relates to a memory device which holds data temporarily and can be used as a data processing device, and a driving method thereof.

2. Description of the Related Art

As for data processing devices such as micro processing units (MPUs), improvement of operation frequency and miniaturization of elements have been researched and developed in order to improve performance and reduce power consumption. On the other hand, power consumption of data processing devices due to leakage power caused by miniaturization of elements is increased.

Such a problem of increase in power consumption is tried to be solved by a technique for reducing power consumption such as a power gating technique in which power supply is stopped in a short period during which power supply is not needed. Further, in recent years, a technique, which is called normally off computing, in which even in a circuit which always needs power supply, needed data is saved in a nonvolatile memory device and power is supplied only when necessary has attracted attention.

Patent Document 1 discloses a structure in which a magnetoresistive random access memory (MRAM) is used as a nonvolatile memory device, data of a microprocessor is saved in the MRAM when power supply is stopped, and the data of the microprocessor is restored when the power supply is restarted.

REFERENCE

Patent Document

[Patent Document 1] PCT international Publication No. 2009/136442

SUMMARY OF THE INVENTION

MRAMs have excellent operation speed, miniaturization, and number of write cycles and are hopeful as memory devices for realizing normally off computing. However, in MRAMs, data is written by supplying current to a memory element which can be in a high resistance state and a low resistance state. When power supply is stopped and restarted frequently by the power gating technique, power consumption is increased because current is supplied to memory elements of MRAMs in writing data.

An object of one embodiment of the present invention is to reduce power consumption, even in a circuit which always needs power supply, at the time of writing data to a memory device included in the circuit, with a structure in which power supply is stopped in a period which does not need power supply.

In one embodiment of the present invention, to solve the above problem, a volatile memory portion and a nonvolatile memory portion are provided in a memory device included in a circuit which always needs power supply. As a memory element for storing data stored in the volatile memory portion which is included in the nonvolatile memory portion, a variable resistance memory element whose resistance value can be varied depending on voltage applied between both end terminals thereof is used.

One embodiment of the present invention is a memory device including a volatile memory portion and a nonvolatile memory portion. The nonvolatile memory portion includes a variable resistance memory element which stores data stored in the volatile memory portion. The variable resistance memory element is an element whose resistance value can be varied in accordance with voltage applied between both end terminals.

One embodiment of the present invention is a memory device including a volatile memory portion and a nonvolatile memory portion. The nonvolatile memory portion includes a variable resistance memory element which stores data stored in the volatile memory portion. The variable resistance memory element is an element whose resistance value can be varied in accordance with voltage applied between both end terminals. The nonvolatile memory portion includes a voltage switching circuit which switches voltage applied to the variable resistance memory element in accordance with the data and a reading load element for outputting the data in accordance with a resistance value of the variable resistance memory element.

One embodiment of the present invention is a memory device including a volatile memory portion and a nonvolatile memory portion. The nonvolatile memory portion includes a variable resistance memory element which stores data stored in the volatile memory portion. The variable resistance memory element is an element whose resistance value can be varied in accordance with voltage applied between both end terminals. A first control signal and a second control signal for controlling storage of the data and output of the data to the volatile memory portion are input to the nonvolatile memory portion. The nonvolatile memory portion includes a voltage switching circuit which switches voltage applied to the variable resistance memory element in accordance with the data by the first control signal and the second control signal and a reading load element for outputting the data in accordance with a resistance value of the variable resistance memory element.

In one embodiment of the present invention, the memory device is preferable in which the first control signal and the second control signal are signals for turning on and off a switch for storage of data or output of data to the volatile memory portion in accordance with stop and restart of power supply to the volatile memory portion and the nonvolatile memory portion.

In one embodiment of the present invention, the memory device is preferable in which the variable resistance memory element is an element including electrodes and a transition metal oxide between the electrodes.

One embodiment of the present invention is a data processing device including an address management portion, a program memory, an instruction register, an instruction decoder, a control portion, a register group, an arithmetic unit, and an arithmetic register. The instruction register, the register group, and the arithmetic register include the above described memory device.

One embodiment of the present invention is a method for driving a memory device including steps of storing data stored in a volatile memory portion in a nonvolatile memory portion including a variable resistance memory element whose resistance value can be varied in accordance with voltage applied between both end terminals, and controlling stop and restart of power supply to the volatile memory portion and the nonvolatile memory portion.

One embodiment of the present invention is a method for driving a memory device including steps of storing data stored in a volatile memory portion in a nonvolatile memory portion including a variable resistance memory element whose resistance value can be varied in accordance with voltage applied between both end terminals by switching voltage applied to the variable resistance memory element and stopping power supply to the volatile memory portion and the nonvolatile memory portion, restarting the power supply to the volatile memory portion and the nonvolatile memory portion, converting the data stored in the nonvolatile memory portion as a resistance value of the variable resistance memory element into a voltage value, and outputting the voltage value to the volatile memory portion.

In one embodiment of the present invention, the method for driving a memory device preferably further includes steps of switching whether voltage is applied to the variable resistance memory element or not by a first control signal and switching a polarity of the voltage applied to the variable resistance memory element by the data and a second control signal.

According to one embodiment of the present invention, power consumption can be reduced with use of a variable resistance memory element whose resistance value can be varied depending on voltage applied between both end terminals of the memory element, compared to a memory element of an MRAM, which has a resistance value varied by supplying current to the memory element.

BRIEF DESCRIPTION OF THE DRAWINGS

In the accompanying drawings:

FIG. 3 is a circuit diagram illustrating operation of a memory device;

DETAILED DESCRIPTION OF THE INVENTION

Figure 1A:
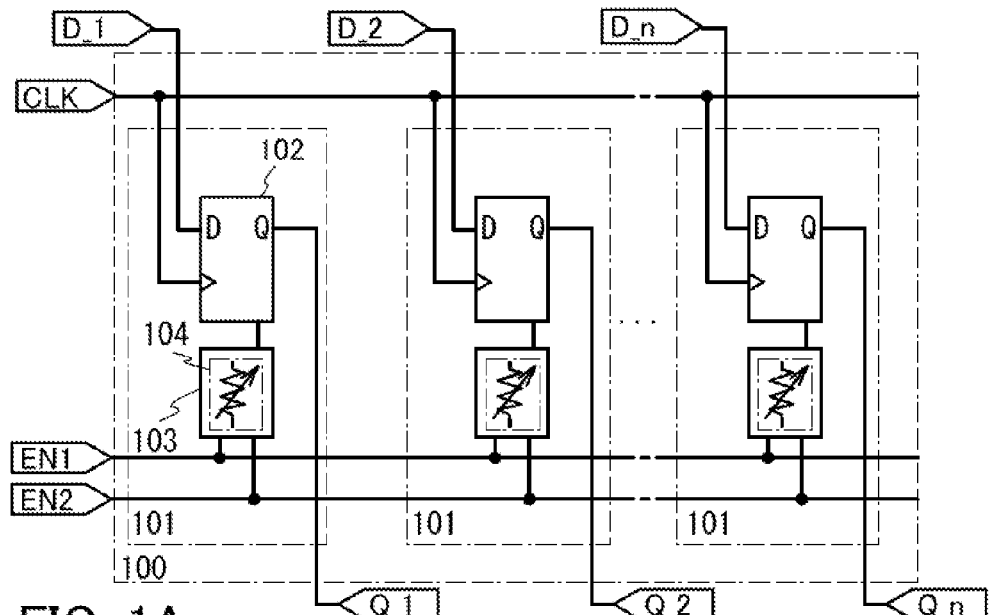
FIGS. 1A and 1B are circuit diagrams illustrating a configuration of a memory device.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention should not be construed as being limited to the following description of the embodiments. Note that in structures of the present invention described below, reference numerals denoting the same portions are used in common in different drawings.

Note that the size of components and the thickness of layers illustrated in the drawings of the embodiments and the like are exaggerated in some cases for simplicity. Therefore, the scale is not necessarily limited to that illustrated in the drawings and the like. Note that drawings are schematic views of ideal examples, and the embodiments of the present invention are not limited to the shape or the value illustrated in the drawings. For example, variation in signal, voltage, or current due to noise or difference in timing can be included.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification, ordinal numbers such as "first", "second", and "third" are used in order to avoid confusion among components, and the terms do not limit the components numerically.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Note that in this specification, when it is described that "A and B are connected to each other", the case where A and B are electrically connected to each other is included in addition to the case where A and B are directly connected to each other. Here, the description "A and B are electrically connected to each other" means the following case: when an object having any electrical function exists between A and B, an electric signal can be transmitted and received between A and B.

Note that in this specification, terms for describing arrangement, such as "over" and "under", are used for convenience for describing a positional relation between components with reference to drawings. Further, a positional relation between components is changed as appropriate in accordance with a direction in which each component is described. Thus, there is no limitation to terms used in this specification, and description can be made appropriately depending on the situation.

Note that positional relations of circuit blocks in block diagrams are specified for description, and even in the case where different circuit blocks have different functions, they may be provided in an actual circuit or region so that different functions are achieved in the same circuit or region. Functions of circuit blocks in block diagrams are specified for description, and even in the case where one circuit block is illustrated, blocks may be provided in an actual circuit or region so that processing performed by one circuit block is performed by a plurality of circuit blocks.

(Embodiment 1)

A memory device includes a volatile memory portion and a nonvolatile memory portion including a variable resistance memory element whose resistance value can be varied in accordance with voltage applied between both end terminals of the memory element. One-bit or multi-bit data can be stored in a unit memory block including the volatile memory portion and the nonvolatile memory portion. In this embodiment, first, a memory device holding n-bit (n is a natural number) data is described, and then, a detailed configuration of a unit memory element holding one-bit data is described.

Note that memory devices are devices including elements utilizing semiconductor characteristics. Thus, in this specification, a memory device may be referred to as a semiconductor device.

FIG. 1A is an example of a block diagram of a memory device. A memory device 100 illustrated in FIG. 1A includes n unit memory blocks 101.

The unit memory block 101 includes a volatile memory portion 102 and a nonvolatile memory portion 103.

For example, the volatile memory portion 102 can be a flip-flop. In FIG. 1A, a D-flip-flop is used as the flip-flop. Power is supplied to the volatile memory portion 102 with a high power supply potential VDD and a low power supply potential VSS, and a clock signal CLK and data D_1 to D_n are input into the volatile memory portions 102. A structure in which a signal for control is also input may be used depending on a circuit configuration of the volatile memory portion 102. The data D_1 to D_n input into terminals D of the volatile memory portions 102 are held and output from output terminals Q_1 to Q_n in synchronization with the clock signal.

The nonvolatile memory portion 103 includes a variable resistance memory element 104. The variable resistance memory element 104 illustrated in FIG. 1A is a memory element whose resistance value can be varied in accordance with voltage applied between both end terminals thereof.

Power is supplied to the nonvolatile memory portion 103 with a high power supply potential VDD and a low power supply potential VSS, and a first control signal EN1, a second control signal EN2, and data D_1 to D_n stored in the volatile memory portion 102 are input to the nonvolatile memory portion 103. A structure in which a signal for control is also input may be used depending on a circuit configuration of the nonvolatile memory portion 103. Writing and reading of Data D_1 to D_n stored in the nonvolatile memory portion 103 are controlled by the first control signal EN1 and the second control signal EN2.

The variable resistance memory element 104 is a resistance random access memory (ReRAM) utilizing colossal electro resistance. A ReRAM is a memory element capable of storing data by utilizing reversible change of resistance of the element which is caused by electric field generated by applying voltage between both end terminals of the memory element.

ReRAMs can be roughly classified into bipolar type in which a memory element is switched between a high resistance state and a low resistance state by polarity of voltage applied between both end terminals of the memory element and nonpolar type in which a memory element is switched between a high resistance state and a low resistance state by the absolute value of voltage applied between both end terminals of the memory element. In this embodiment, description is made assuming that a bipolar memory element is used as a ReRAM; however, by setting applied voltage as appropriate, the bipolar memory element can be replaced with a nonpolar memory element.

Note that ReRAMs are memory elements which store data as change in resistance, like MRAMs and phase change random access memories (PRAMs); however, ReRAMs are known to operate by a mechanism different from those of other memory elements. ReRAMs are different from MRAMs and PRAMs in that in writing data, the change in resistance of ReRAMs is caused by voltage application and the change in resistance of MRAMs and PRAMs is caused by supplying current to elements.

By writing data, MRAMs or PRAMs can be in two states: a high resistance state and a low resistance state. Thus, at the time of writing data, it is necessary to supply current by applying a high voltage between both end terminals of a memory element. In MRAMs or PRAMs, by applying a high voltage to supply current, power consumption is increased.

On the other hand, ReRAMs are memory elements which can store data by utilizing reversible change in resistance of elements by electric field generated by applying voltage between both end terminals of the memory elements as described above. Thus, in ReRAMs, data can be written with little current flowing to a memory element.

In other words, the memory device 100 which includes a ReRAM in the nonvolatile memory portion 103 can achieve lower power consumption than a structure in which an MRAM is included in the nonvolatile memory portion 103.

As a specific structure of a ReRAM, a capacitor-type structure in which a transition metal oxide is sandwiched between electrodes may be used. As a transition metal oxide for a ReRAM, for example, a three-component material having a perovskite structure represented by AA'BO$_3$ such as Pr$_X$Ca$_{(1-X)}$MnO$_3$ (PCMO; X is greater than 0 and less than 1) may be used.

In a three-component perovskite structure, at an A site, at least one element selected from the element group of La, Ce, Bi, Pr, Nd, Pm, Sm, Y, Sc, Yb, Lu, and Gd may be used. At an A' site, at least one element selected from the element group of Mg, Ca, Sr, Ba, Pb, Zn, and Cd may be used. At a B site, at least one element selected from the element group of Mn, Ce, V, Fe, Co, Nb, Ta, Cr, Mo, W, Zr, Hf, and Ni may be used. Note that part of an O site may have an oxygen defect.

Further, as a transition metal oxide for a ReRAM, a metal oxide including at least one element selected from the element group of Ni, Al, Hf, Zr, Ti, Ba, Sr, Ta, La, Fe, Cu, Nb, and Y may be used.

As the electrodes between which the transition metal oxide is sandwiched, a material having a high work function such as Pt is used in the case of using an n-type transition metal oxide including Ti or Ta; thus, the ReRAM can be preferably switched between a high resistance state and a low resistance state. A material having a low work function such as Ti or Ta is used in the case of using a p-type transition metal oxide including Co or Ni; thus, the ReRAM can be well switched between a high resistance state and a low resistance state.

Note that the transition metal oxide may include other elements of nitrogen and/or fluorine.

However, there are still many unknown things about the mechanism of ReRAMs, and the ReRAMs might have a structure other than the above structures described as examples.

In this embodiment, an example of using a three-component material having a perovskite structure like PCMO for the ReRAM is described. A ReRAM including a transition metal oxide having a perovskite structure can be used as a bipolar memory element, except in some cases.

The first control signal EN1 and the second control signal EN2 are signals for controlling writing and reading data to the variable resistance memory element 104 of the nonvolatile memory portion 103. Specifically, the first control signal EN1 and the second control signal EN2 are used to turn on and off switches included in the nonvolatile memory portion 103, for switching voltage applied to the variable resistance memory element 104 in accordance with data of the volatile memory portion 102 to be held and for switching connection of a reading resistor for reading data in accordance with the resistance value level of the variable resistance memory element 104.

Figure 1B:
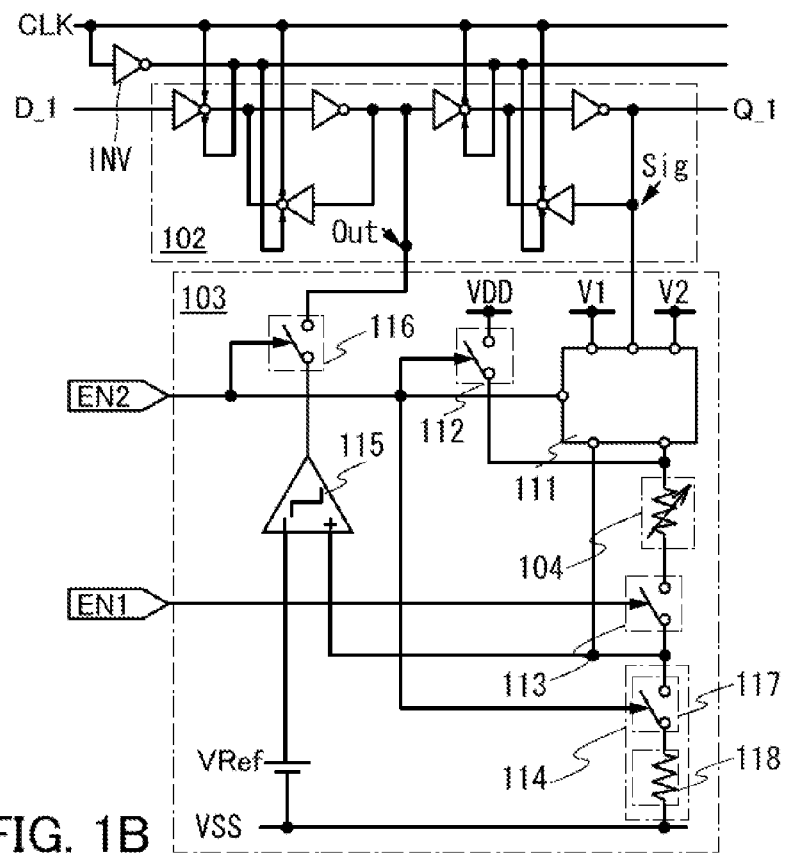

Next, FIG. 1B illustrates specific circuit configurations of the volatile memory portion 102 and the nonvolatile memory portion 103 which are included in the unit memory block 101 illustrated in FIG. 1A.

In FIG. 1B, as the specific circuit configuration of the volatile memory portion 102, a flip-flop in which an inverter and a clocked inverter are combined is shown. Note that in FIG. 1B, by inputting the clock signal CLK to an inverter INV, an inverted clock signal is generated. An inverted clock signal may be input from an external portion.

In FIG. 1B, in the case where data stored in the volatile memory portion 102 is written to the nonvolatile memory portion 103 to stop power supply to the memory device 100, a potential of a node Sig is sampled. Further, in the case where data stored in the nonvolatile memory portion 103 is read to the volatile memory portion 102 to restart the power supply to the memory device 100, a potential based on the data is output to a node Out.

In FIG. 1B, in the specific circuit configuration of the nonvolatile memory portion 103, in addition to the variable resistance memory element 104, a voltage switching circuit 111, a switch 112, a switch 113, a reading load element 114, a comparator 115, and a switch 116 are included. The nonvolatile memory portion 103 is supplied with writing potentials V1 and V2 for writing data to the variable resistance memory element 104, in addition to the high power supply potential VDD and the low power supply potential VSS for supplying power supply voltage through wirings. The variable resistance memory element 104 is supplied with a reference voltage VRef input to the comparator 115.

The voltage switching circuit 111 is a circuit which switches voltage applied to the variable resistance memory element 104 in accordance with data stored in the volatile memory portion 102. Specifically, the voltage switching circuit 111 is a circuit which switches the polarity of writing voltage with writing potentials V1 and V2 applied between both end terminals of the variable resistance memory element 104 in accordance with a potential of the node Sig of the volatile memory portion 102. The voltage switching circuit 111 is controlled by the second control signal EN2 and the potential of the node Sig.

Note that in this specification, the description is made assuming that the potential V1 is higher than the potential V2. Note that the potential V1 is higher than the high power supply potential VDD, and the potential V2 is lower than the low power supply potential VSS. This is in order to write data to the ReRAM which is a variable resistance memory element.

The switch 112 is a switch for switching whether one terminal of the variable resistance memory element 104 and a wiring supplied with the high power supply potential VDD are connected to each other or not. The switch 112 is controlled by the second control signal EN2.

The switch 113 is a circuit which is connected to the other terminal of the variable resistance memory element 104 and controls whether a voltage for writing data and a voltage for reading data are applied to the variable resistance memory element 104 or not. Specifically, by turning on the switch 113, a voltage for writing data and a voltage for reading data are applied to the variable resistance memory element 104, and by turning off the switch 113, the potential of the other terminal of the variable resistance memory element 104 is set in a floating state. The switch 113 is controlled by the first control signal EN1.

The reading load element 114 is connected to the variable resistance memory element 104 through the switch 113. In the reading load element 114, whether the resistor is enabled or not when data stored as the resistance value level of the variable resistance memory element 104 is read is controlled by the second control signal EN2.

For example, as a structure of the reading load element 114, a structure in which a switch 117 and a resistor 118 are included as illustrated in FIG. 1B can be used. When the switch 117 is on, data stored as the resistance value level of the variable resistance memory element 104 can be read. When the switch 117 is turned on at the same timing as the switch 112 and the switch 113 is turned on, the variable resistance memory element 104 and the resistor 118 can be connected in series between the high power supply potential VDD and the low power supply potential VSS for supply power supply voltage. In such a state, depending on the resistance value level of the variable resistance memory element 104, a potential of a node between the variable resistance memory element 104 and the resistor 118 can be obtained as a value which is divided by the two resistors.

Although a structure in which a resistor is used for the reading load element 114 is used in FIG. 1B, a constant current source may be used. As a constant current source, a structure in which constant voltage is applied to a gate of a transistor may be used. In the structure in which a constant current source is used, as in the structure in which a resistor is used, data stored as the resistance value level of the variable resistance memory element 104 can be read.

The potential of a node between the variable resistance memory element 104 and the resistor 118 is input to one input terminal of the comparator 115, and the reference voltage VRef is input to the other input terminal of the comparator 115. Then, the comparator 115 outputs data stored in the nonvolatile memory portion 103 which is a signal based on the resistance value level of the variable resistance memory element 104 to an output terminal. No that VRef is preferably an intermediate potential between the high power supply potential VDD and the low power supply potential VSS.

Via the switch 116, a signal output from the comparator 115 is output to the node Out in accordance with the second control signal EN2.

Next, a specific circuit operation of the nonvolatile memory portion 103 included in the unit memory block 101 illustrated in FIG. 1B is described with a timing chart. FIG. 3 is a circuit diagram of the nonvolatile memory portion 103 illustrated in FIG. 1B, in which nodes and terminals are denoted by reference numerals. Further, FIGS. 4A and 4B, FIGS. 5A and 5B, FIGS. 6A and 6B, and FIG. 7 are circuit diagrams schematically showing states of switches and resistors of the nonvolatile memory portions 103 in periods T0 to T6 in the timing chart in FIG. 2 by using the circuit diagram in FIG. 3.

Figure 2:
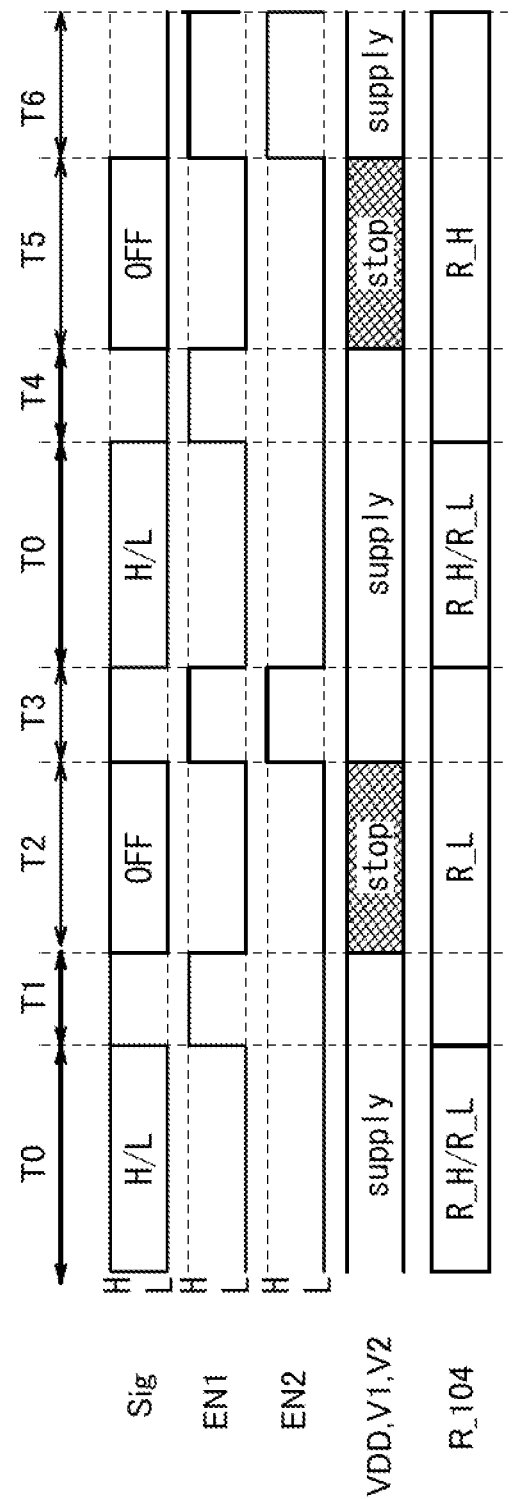
FIG. 2 is a timing chart showing operation of a memory device.

In the timing chart in FIG. 2, changes in a potential of the node Sig of the volatile memory portion 102 in FIG. 1B, a potential of the first control signal EN1, a potential of the second control signal EN2, whether or not the power supply voltage, V1, and V2 are supplied, and a resistance value level of the variable resistance memory element (R_104) in states are shown.

Note that in FIG. 2, a potential of each signal is described using two levels, that is, an H level and an L level. Further, as for the potential of the node Sig, a value of an H level or an L level held in a period during which the volatile memory portion 102 operates is referred to as "H/L", and a state in which there is no stored data because of stop of supply of the power supply voltage to the volatile memory portion 102 is referred to as "OFF". Furthermore, as for whether the power supply voltage, V1, and V2 are supplied or not, a period during which the power supply voltage with the high power supply potential VDD and the low power supply potential VSS, the potential V1, and the potential V2 are supplied is referred to as "supply", and a period during which the supply is stopped is referred to as "stop". As for the resistance value of the variable resistance memory element 104, R_H means a high resistance state and R_L means a low resistance state.

In the circuit diagram in FIG. 3, for description, terminals of the variable resistance memory element 104, the switch 113, and the voltage switching circuit 111 are denoted by reference numerals. One terminal of the variable resistance memory element 104 is referred to as r1, and the other terminal thereof is referred to as r2. A terminal of the switch 113, which is connected to the comparator 115 is referred to as Vout. Each terminal of the voltage switching circuit 111 is denoted by reference numerals. A terminal A, a terminal B, a terminal C, and a terminal D are connected to a wiring for supplying the potential V1, a wiring for supplying the potential V2, the node Vout, and r1, respectively.

When the input second control signal EN2 is at the L level and data input from the volatile memory portion 102 is at the H level (Sig_H) in the voltage switching circuit 111, the terminal A and the terminal C are connected to each other and the terminal B and the terminal D are connected to each other. When the input second control signal EN2 is at the L level and the data input from the volatile memory portion 102 is at the L level (Sig_L) in the voltage switching circuit 111, the terminal A and the terminal D are connected to each other and the terminal B and the terminal C are connected to each other. When the input second control signal EN2 is at the H level in the voltage switching circuit 111, connection between the terminals is not made regardless of data input from the volatile memory portion 102.

In the circuit diagram in FIG. 3, for description, the switch 113, the switch 112, the switch 117, and the switch 116 are referred to as SW1, SW2, SW3, and SW4, respectively.

The period T0 is a period during which the power supply voltage is supplied to the memory device 100 and the volatile memory portion 102 operates and holds data. In the period T0, the first control signal EN1 is at the L level, the second control signal EN2 is at the L level, and supply of the power supply voltage, V1, and V2 is performed. Note that the resistance value of the variable resistance memory element 104 depends on data written to the variable resistance memory element 104 in a previous period; therefore, the resistance value is referred to as "R_H/R_L" in the period T0.

Figure 4A:
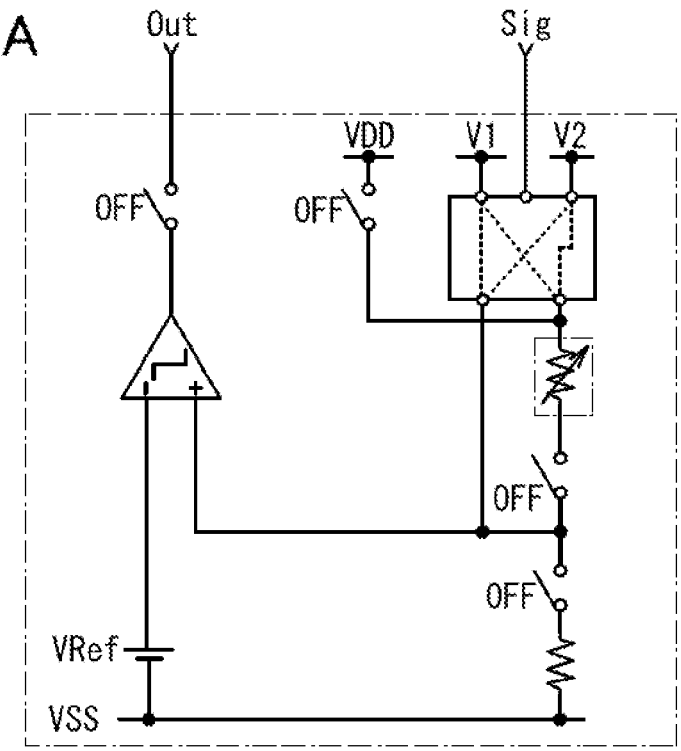
FIGS. 4A and 4B are circuit diagrams illustrating each operation of a memory device.

The state of the circuit in FIG. 3 in the period T0 is shown in FIG. 4A. In other words, even when SW1, SW2, SW3, and SW4 are turned off and terminals of the voltage switching circuit 111 are connected in any way, voltage is not applied between both end terminals of the variable resistance memory element 104.

The period T1 is a period during which the memory device 100 is supplied with the power supply voltage, and data at the H level (Sig_H) stored in the volatile memory portion 102 is written to and held by the variable resistance memory element 104 of the nonvolatile memory portion 103. In the period T1, the first control signal EN1 is at the H level, the second control signal EN2 is at the L level, and the supply of the power supply voltage, V1, and V2 is performed. When the terminal r1 of the variable resistance memory element 104 becomes V2 and the terminal r2 thereof becomes V1, voltage is applied, so that the resistance value of the variable resistance memory element 104 becomes the low resistance state R_L in the period T1.

Figure 4B:
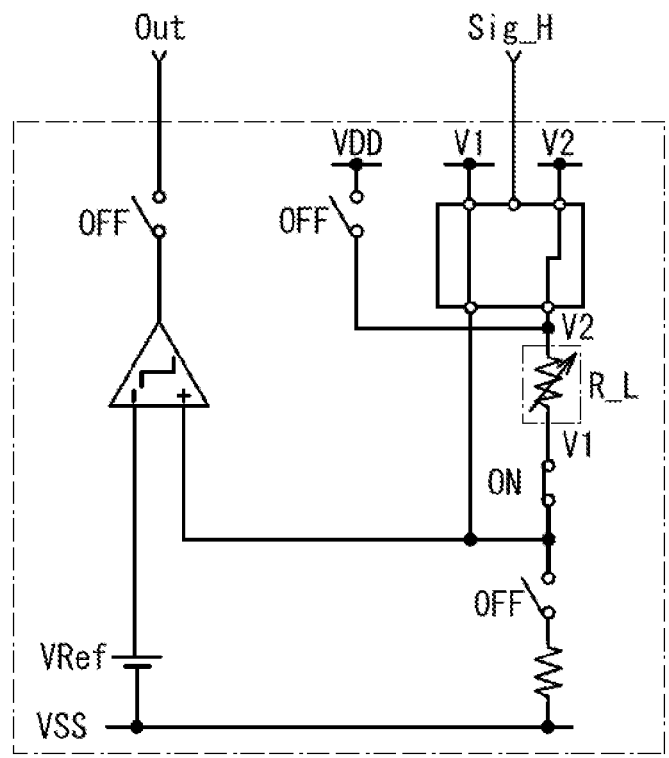

The state of the circuit in FIG. 3 in the period T1 is shown in FIG. 4B. In other words, SW1 is on and SW2, SW3, and SW4 are off, and in the voltage switching circuit 111, switching is performed in accordance with the data at the H level (Sig_H) held in the volatile memory portion 102 so that the terminal A and the terminal C are connected to each other and the terminal B and the terminal D are connected to each other. Thus, the terminal r1 of the variable resistance memory element 104 becomes V2 and the terminal r2 thereof becomes V1, and the variable resistance memory element 104 becomes the low resistance state R_L in accordance with voltage applied between both the end terminals.

The period T2 is a period during which the data (Sig_H) stored by setting the variable resistance memory element 104 of the nonvolatile memory portion 103 to the low resistance state is held even when the supply of the power supply voltage to the memory device 100 is stopped. In the period T2, data is not input from the volatile memory portion 102 (Sig_OFF), the first control signal EN1 is at the L level, the second control signal EN2 is at the L level, and the supply of the power supply voltage, V1, and V2 is stopped. The resistance value of the variable resistance memory element 104 remains the low resistance state R_L written in the period T1 which is the previous period.

Figure 5A:
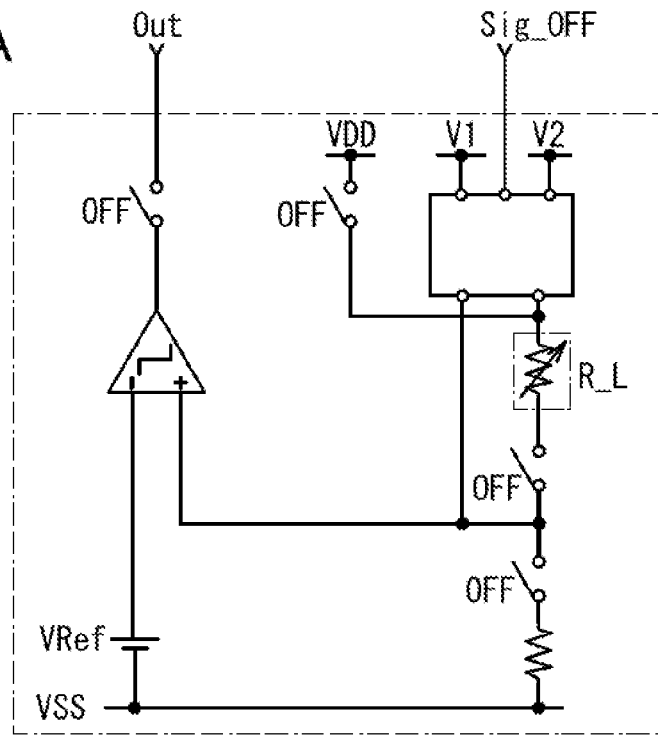
FIGS. 5A and 5B are circuit diagrams illustrating each operation of a memory device.

The state of the circuit in FIG. 3 in the period T2 is shown in FIG. 5A. In other words, SW1, SW2, SW3, and SW4 are off, and connection between the terminals is not made in the voltage switching circuit 111. The variable resistance memory element 104 holds the low resistance state R_L, and data written before the power supply is stopped is held.

Note that data is written to the nonvolatile memory portion 103 shortly before the power supply is stopped; however, data may be written to the nonvolatile memory portion 103 in another period. For example, with a timer or the like, data may be regularly written from the volatile memory portion 102 to the nonvolatile memory portion 103.

The period T3 is a period during which the supply of the power supply voltage to the memory device 100 is restarted, the data (Sig_H) stored by setting the variable resistance memory element 104 of the nonvolatile memory portion 103 to the low resistance state is read to the volatile memory portion 102 again. In the period T3, the data (Sig_H) read from the nonvolatile memory portion 103 is held in the volatile memory portion 102, the first control signal EN1 is at the H level, the second control signal EN2 is at the H level, and the supply of the power supply voltage, V1, and V2 is performed. The resistance value of the variable resistance memory element 104 is in the low resistance state R_L written in the period T1 which is the previous period.

Figure 5B:
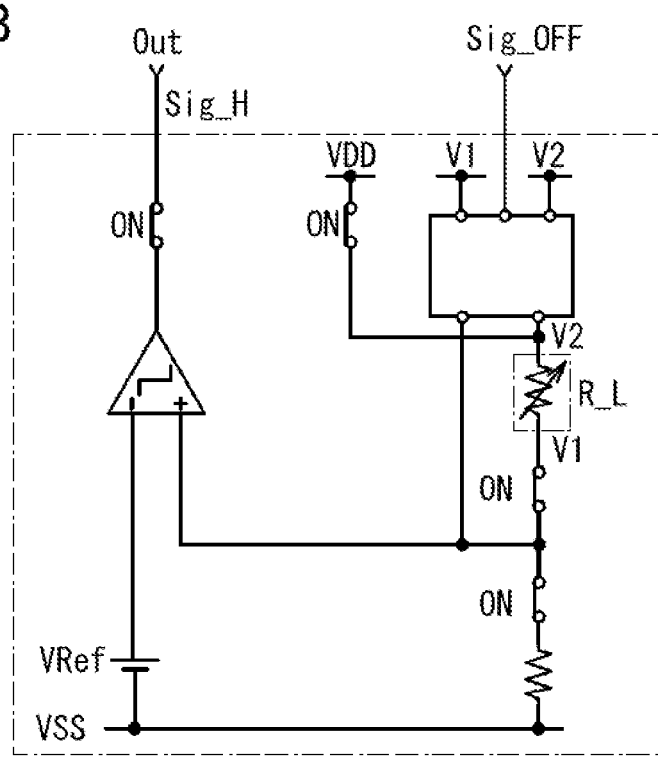

The state of the circuit in FIG. 3 in the period T3 is shown in FIG. 5B. In other words, SW1, SW2, SW3, and SW4 are on, and connection between the terminals is not made in the voltage switching circuit 111. The variable resistance memory element 104 is in the low resistance state R_L, and the two resistors are connected to each other in series between the resistor 118 of the reading load element 114 and the wiring for supplying the power supply voltage.

In the period T3, since the variable resistance memory element 104 is in the low resistance state R_L, the potential of the node Vout can be obtained as a value which is divided by the two resistors. In the period T3, since the variable resistance memory element 104 is in the low resistance state, a potential close to the high power supply potential VDD is input to the comparator 115. In the comparator 115, by inputting a potential higher than VRef, Sig_H which is a signal at the H level can be output and read to the node Out on the volatile memory portion side through SW4.

The period T4 is a period during which the memory device 100 is supplied with the power supply voltage, and data at the L level (Sig_L) held in the volatile memory portion 102 is written to and held by the variable resistance memory element 104 of the nonvolatile memory portion 103. In the period T4, the first control signal EN1 is at the H level, the second control signal EN2 is at the L level, and the supply of the power supply voltage, V1, and V2 is performed. When the terminal r1 of the variable resistance memory element 104 becomes V1 and the terminal r2 thereof becomes V2, voltage is applied, so that the resistance value of the variable resistance memory element 104 becomes the high resistance state R_H in the period T4.

Figure 6A:
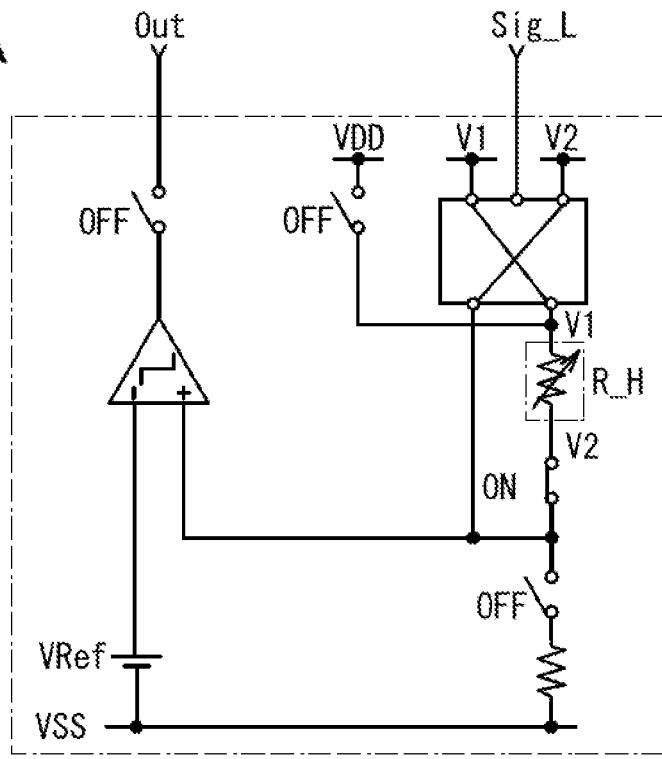
FIGS. 6A and 6B are circuit diagrams illustrating each operation of a memory device.

The state of the circuit in FIG. 3 in the period T4 is shown in FIG. 6A. In other words, SW1 is on and SW2, SW3, and SW4 are off, and in the voltage switching circuit 111, switching is performed in accordance with the data at the L level (Sig_L) held in the volatile memory portion 102 so that the terminal A and the terminal D are connected to each other and the terminal B and the terminal C are connected to each other. Thus, the terminal r1 of the variable resistance memory element 104 becomes V1 and the terminal r2 thereof becomes V2, and the variable resistance memory element 104 becomes the high resistance state R_H in accordance with voltage applied between both the end terminals.

The period T5 is a period during which the data (Sig_L) stored by setting the variable resistance memory element 104 of the nonvolatile memory portion 103 to the high resistance state is held even when the supply of the power supply voltage to the memory device 100 is stopped. In the period T5, data is not input from the volatile memory portion 102 (Sig_OFF), the first control signal EN1 is at the L level, the second control signal EN2 is at the L level, and the supply of the power supply voltage, V1, and V2 is stopped. The resistance value of the variable resistance memory element 104 remains the high resistance state R_H written in the period T4 which is the previous period.

Figure 6B:
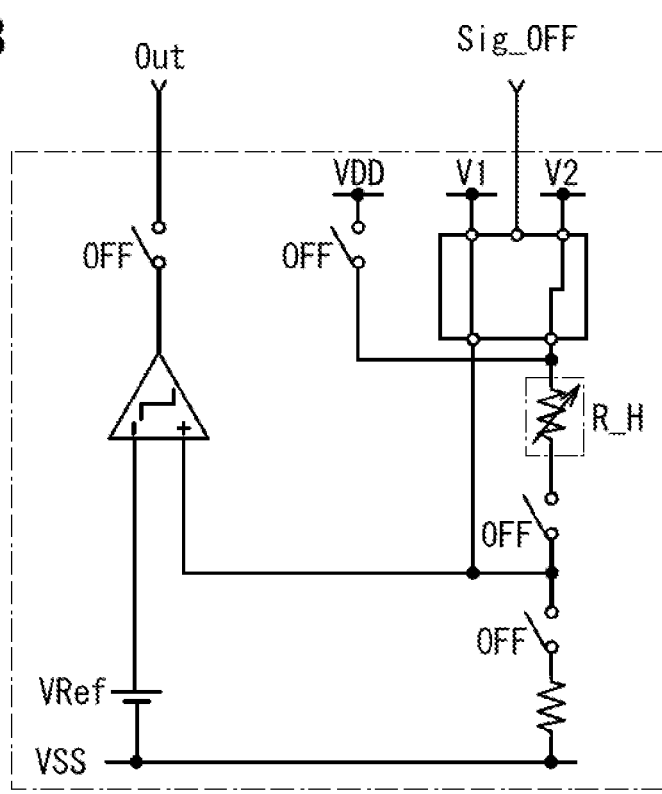

The state of the circuit in FIG. 3 in the period T5 is shown in FIG. 6B. In other words, SW1, SW2, SW3, and SW4 are off, and connection between the terminals is not made in the voltage switching circuit 111. The variable resistance memory element 104 is in the high resistance state R_H, and data written before the power supply is stopped is held.

The period T6 is a period during which the supply of the power supply voltage to the memory device 100 is restarted and data (Sig_L) stored by setting the variable resistance memory element 104 of the nonvolatile memory portion 103 to the high resistance state is read to the volatile memory portion 102 again. In the period T6, the data (Sig_L) read from the nonvolatile memory portion 103 is held in the volatile memory portion 102, the first control signal EN1 is at the H level, the second control signal EN2 is at the H level, and the supply of the power supply voltage, V1, and V2 is performed. The resistance value of the variable resistance memory element 104 is in the high resistance state R_H written in the period T4 which is the previous period.

Figure 7:
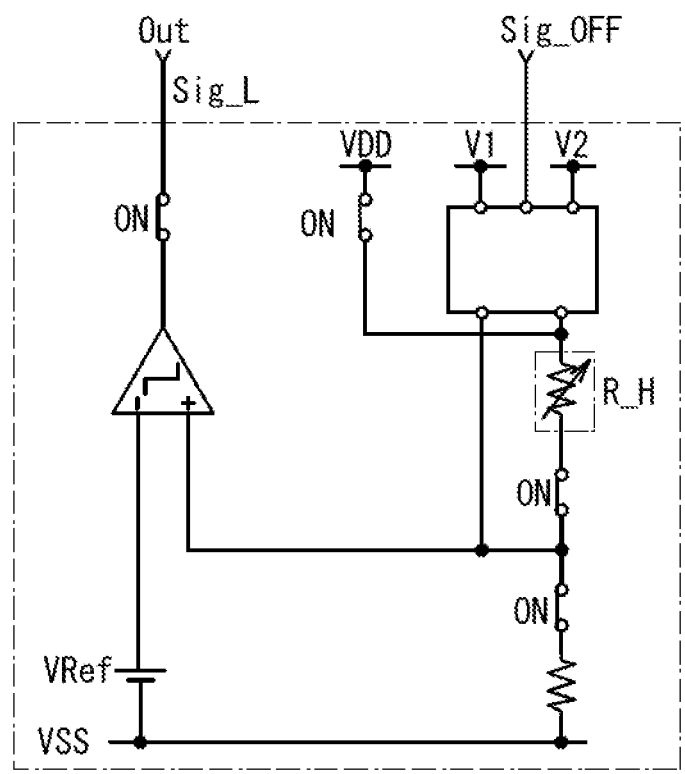
FIG. 7 is a circuit diagram illustrating operation of a memory device.

The state of the circuit in FIG. 3 in the period T6 is shown in FIG. 7. In other words, SW1, SW2, SW3, and SW4 are on, and connection between the terminals is not made in the voltage switching circuit 111. The variable resistance memory element 104 is in the high resistance state R_H, and the two resistors are connected to each other in series between the resistor 118 of the reading load element 114 and the wiring for supplying the power supply voltage.

In the period T6, since the variable resistance memory element 104 is in the high resistance state R_H, the potential of the node Vout can be obtained as a value which is divided by the two resistors. In the period T6, since the variable resistance memory element 104 is in the high resistance state, a potential close to the low power supply potential VSS is input to the comparator 115. In the comparator 115, by inputting a potential lower than VRef, Sig_L which is a signal at the L level can be output and read to the node Out on the volatile memory portion side through SW4.

The above is the description of the timing chart of the specific circuit operation of the nonvolatile memory portion 103 included in the unit memory block 101 illustrated in FIG. 1B.

Figure 8:
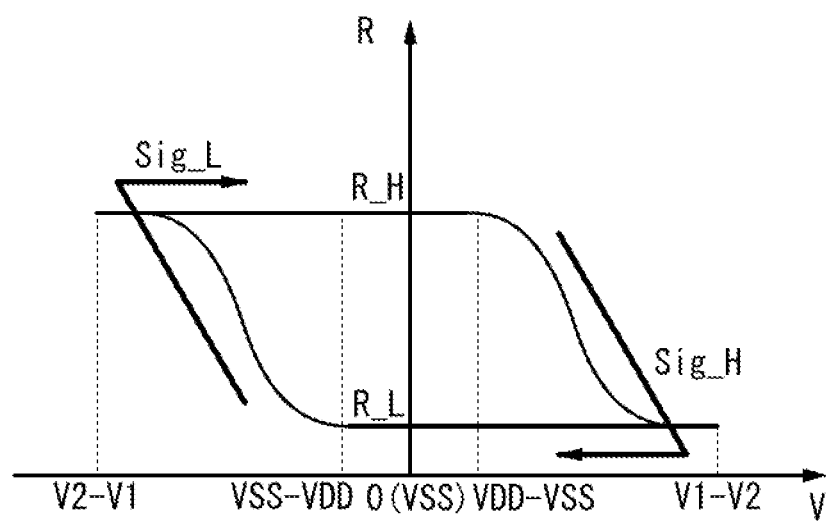
FIG. 8 is a diagram illustrating a variable resistance memory element.

The resistance value level of the variable resistance memory element 104 changes in accordance with voltage applied between both the end terminals. FIG. 8 is a graph schematically showing a relation between voltage and resistance of the variable resistance memory element described with FIG. 2, FIG. 3, FIGS. 4A and 4B, FIGS. 5A and 5B, FIGS. 6A and 6B, and FIG. 7. In FIG. 8, the horizontal axis represents applied voltage, and the vertical axis represents a resistance value.

As shown in FIG. 8, the resistance value level of a bipolar ReRAM changes in accordance with polarity of applied voltage. Specifically, the variable resistance memory element 104 is supplied with a voltage higher than the power supply voltage (VDD-VSS), such as (V1-V2), from the voltage switching circuit 111 in accordance with data at the L level (Sig_L) held in the volatile memory portion 102. Thus, the variable resistance memory element 104 becomes the low resistance state R_L. Further, the variable resistance memory element 104 is supplied with a voltage with inverted polarity, such as (V2-V1), from the voltage switching circuit 111 in accordance with data at the H level (Sig_H) held in the volatile memory portion 102. Thus, the variable resistance memory element 104 becomes the high resistance state R_H.

When the low resistance state R_L or the high resistance state R_H is obtained once, a bipolar ReRAM can hold a resistance value based on applied voltage until voltage at which the resistance is changed is applied. Note that application of voltage to the variable resistance memory element 104 with the high power supply potential VDD and the low power supply potential VSS for supplying the power supply voltage used for data reading does not change the resistance value, and data can be held after the data reading.

With the use of a variable resistance memory element whose resistance value can be varied in accordance with voltage applied between both end terminals of the memory element, the memory device described in this embodiment can have low power consumption compared to a memory element of an MRAM, which has a resistance value varied by supplying current to the memory element.

(Embodiment 2)

In this embodiment, an example of the specific circuit configuration of the voltage switching circuit 111 included in the nonvolatile memory portion 103 described in Embodiment 1 and another configuration of the reading load element 114 are described.

Figure 9:
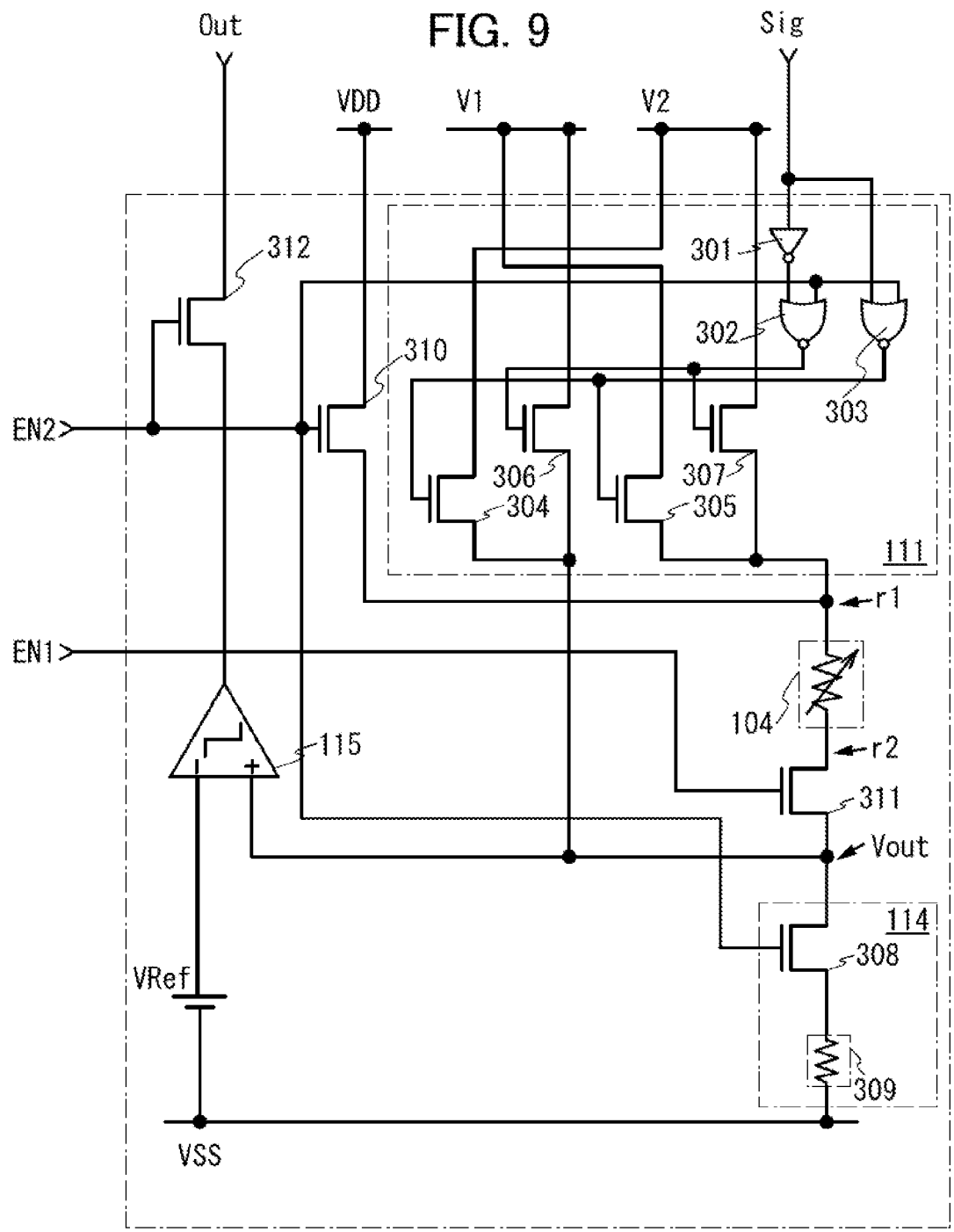
FIG. 9 is a circuit diagram illustrating a structure of a memory device.

The voltage switching circuit 111 in FIG. 9 includes an inverter 301, a NOR circuit 302, a NOR circuit 303, a transistor 304, a transistor 305, a transistor 306, and a transistor 307. The reading load element 114 in FIG. 9 includes a transistor 308 and a resistor 309. In FIG. 9, the switches in FIG. 1B are represented by a transistor 310, a transistor 311, and a transistor 312.

Note that description is made on the assumption that the transistor described in this embodiment is an n-channel transistor; however, the transistor may be a p-channel transistor. In this case, a conduction state may be controlled by inverting the polarity of an input signal.

In the voltage switching circuit 111 in FIG. 9, data of the node Sig of the volatile memory portion 102 is input to the inverter 301. An output signal of the inverter 301 and the second control signal EN2 are input to the NOR circuit 302.

Data of the node Sig of the volatile memory portion 102 and the second control signal EN2 are input to the NOR circuit 303. An output signal of the NOR circuit 303 is input to a gate of the transistor 304 and a gate of the transistor 305. An output signal of the NOR circuit 302 is input to a gate of the transistor 306 and a gate of the transistor 307.

By the output signals of the NOR circuit 302 and the NOR circuit 303, it is possible to select whether the transistor 304 and the transistor 305 are turned on or the transistor 306 and the transistor 307 are turned on. Further, the voltage switching circuit 111 can control the potential V1 and the potential V2 which are connected to the voltage switching circuit 111 so that the potential V1 and the potential V2 are applied between both the end terminals of the variable resistance memory element 104 in a forward direction or a reverse direction in each data.

When the input second control signal EN2 is at the H level, the voltage switching circuit 111 illustrated in FIG. 9 can have a structure in which voltage application between both end terminals of the variable resistance memory element 104 with the potential V1 and the potential V2 is not performed regardless of data of the node Sig input from the volatile memory portion 102. Note that voltage application between both end terminals of the variable resistance memory element 104 with the potential V1 and the potential V2 is performed in such a manner that the voltage switching circuit 111 is controlled as described above and the first control signal EN1 is set to the H level so that the transistor 311 is turned on.

Further, in the reading load element 114 in FIG. 9, the transistor 308 is controlled in the following manner: a source and a drain are set to a conduction state by setting the potential of the second control signal EN2 applied to a gate to the H level; and the source and the drain are set to a non-conduction state by setting the potential of the second control signal EN2 applied to the gate to the L level. The transistor 308 and the transistor 311 are turned on, so that the transistor 308 can connect the resistor 309 to the variable resistance memory element 104 in series. With this state, the potential of the node Vout between the variable resistance memory element 104 and the resistor 309 can be obtained as a value which is divided by the two resistors in accordance with the resistance value level of the variable resistance memory element 104.

Although a structure in which a resistor is used for the reading load element 114 is used in FIG. 9, a constant current source may be used as described in FIG. 1B.

A method for controlling the transistor 310, the transistor 311, and the transistor 312 in FIG. 9 is similar to that of the switch 112, the switch 113, and the switch 116 described in Embodiment 1.

Switches and circuits included in a memory device are formed using transistors, whereby an increase in degree of integration and a reduction in size of the circuit can be achieved.

This embodiment can be implemented by being combined as appropriate with any of the above-described embodiments.
(Embodiment 3)

Figure 10:
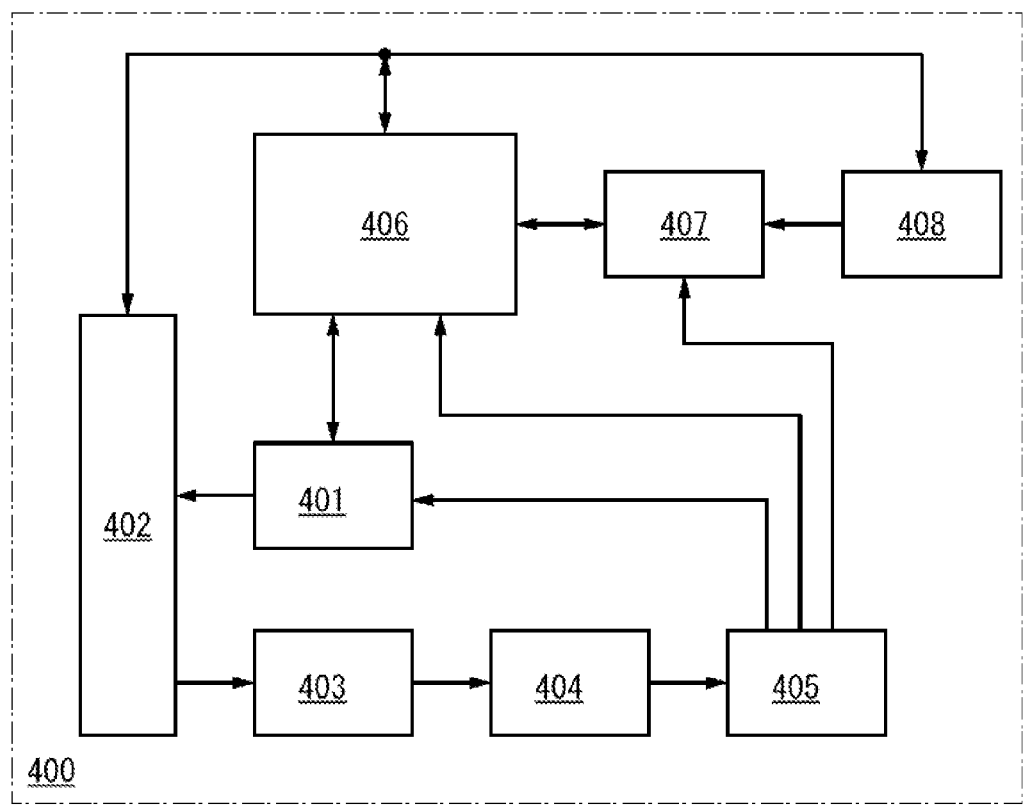
FIG. 10 is a block diagram illustrating a structure of a data processing device.

A specific example where the memory device described in the above embodiment is used for a data processing circuit is described. FIG. 10 shows an example of a block diagram of a data processing circuit.

A data processing circuit 400 includes an address management portion 401, a program memory 402, an instruction register 403, an instruction decoder 404, a control portion 405, a register group 406, an arithmetic logic unit (ALU) 407 corresponding to an arithmetic unit, and an arithmetic register 408.

By control with the control portion 405, the address management portion 401 specifies an address for reading an instruction from the program memory 402 and makes the instruction register 403 take in the instruction. Further, the address management portion 401 manages an address of the register group 406.

The program memory 402 stores a plurality of instructions to be taken in the instruction register 403. The instruction is taken in the instruction register through a data bus by specifying an address.

The instruction register 403 receives the instruction taken in from the program memory 402 and outputs it to the instruction decoder 404.

The instruction decoder 404 decodes the instruction received from the instruction register 403 and makes the control portion 405 perform processing.

The control portion 405 controls data stored in the register group 406 and the ALU 407 to execute the decoded instruction.

The register group 406 temporarily stores data used for an instruction and an arithmetic result.

The ALU 407 performs arithmetic processing on data input from the register group 406 or the arithmetic register and stores it in the resistor again.

The arithmetic register 408 takes in data from the register group 406 or the program memory 402 and outputs it for arithmetic processing in the ALU 407.

The above-described operations of the data processing circuit 400 can be roughly classified into fetch, decode, execution, and write back. Specifically, by fetch processing, an address of the program memory 402 is specified and an instruction is taken in the instruction register 403. By decode processing, the instruction taken in the instruction register 403 is translated by the instruction decoder 404 and processing is performed by the control portion. By execution processing, the control portion 405 controls data stored in the register group 406 and the ALU 407 and arithmetic processing is performed. In write back processing, the result of arithmetic processing performed by the ALU 407 is written to the register group 406 and the written data is written back to the arithmetic register.

The memory device described in Embodiment 1 can be used for the data processing circuit. A data processing device including the memory device described in Embodiment 1 can have lower power consumption.

Note that the memory device described in Embodiment 1 can hold data even when power supply is stopped. Thus, in the instruction register 403, the register group 406, and the arithmetic register 408 in the data processing device, power supply can be stopped intermittently without loss of data. Therefore, power supply is performed only in a period needed for data processing and can be stopped as appropriate depending on the usage. As a result, a data processing device which can perform power gating while maintaining data processing capability can be obtained.

This embodiment can be implemented by being combined as appropriate with any of the above-described embodiments.
(Embodiment 4)

Figure 11:
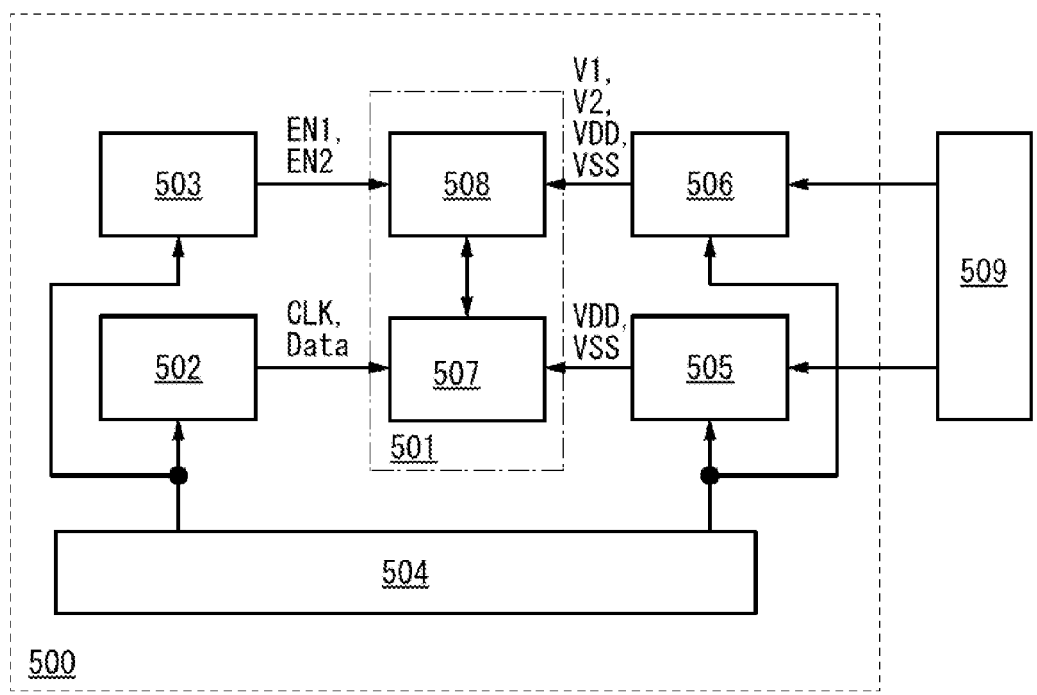
FIG. 11 is a block diagram illustrating a structure of a data processing device.

In this embodiment, a structure example of a data processing device capable of performing power gating for a memory device which can be used for a circuit such as a register included in the data processing device is described. FIG. 11 is a block diagram of the data processing device.

A data processing device 500 illustrated in FIG. 11 includes a memory device 501, a volatile memory portion control signal generation circuit 502, a nonvolatile memory portion control signal generation circuit 503, a power control circuit 504, a volatile memory portion power supply control switch 505, and a nonvolatile memory portion power supply control switch 506. The memory device 501 includes a volatile memory portion 507 and a nonvolatile memory portion 508.

The volatile memory portion 507 is supplied with a high power supply potential VDD and a low power supply potential VSS from a power supply circuit 509 through the volatile memory portion power supply control switch 505. The nonvolatile memory portion 508 is supplied with the high power supply potential VDD, the low power supply potential VSS, the potential V1, and the potential V2 from the power supply circuit 509 through the nonvolatile memory portion power supply control switch 506.

The volatile memory portion control signal generation circuit 502 outputs a clock signal CLK for operating the volatile memory portion 507 and data of the node Sig. The nonvolatile memory portion control signal generation circuit 503 outputs the first control signal EN1 and the second control signal EN2 for operating the nonvolatile memory portion 508.

As the nonvolatile memory portion 508, the variable resistance memory element described in Embodiment 1, which has a resistance value varied depending on voltage applied between both the end terminals of the memory element, can be used, for example. With the structure, power consumption can be reduced compared to a structure of a memory element of an MRAM, which has a resistance value varied by supplying current to the memory element.

The power control circuit 504 has a function of controlling the volatile memory portion power supply control switch 505 and the nonvolatile memory portion power supply control switch 506. For example, the power control circuit 504 controls whether power supply is stopped or not depending on the usage of the data processing device.

Further, the power control circuit 504 controls the volatile memory portion control signal generation circuit 502 and the nonvolatile memory portion control signal generation circuit 503 in accordance with the control of power supply. The volatile memory portion control signal generation circuit 502 and the nonvolatile memory portion control signal generation circuit 503 have a function of controlling whether supply of each signal to be input to the memory device 501 is stopped or restarted.

In the memory device 501, as described in Embodiment 1, data of the volatile memory portion 507 is stored in the nonvolatile memory portion 508 and then, power supply is stopped; thus, unnecessary power consumption can be suppressed. Further, in a data processing device including the memory device 501, power supply is performed only in a period needed for data processing and can be stopped depending on the usage as appropriate. As a result, the data processing device including the memory device 501 can achieve low power consumption by power gating and stop of supply of each signal, while maintaining data processing capability.

This embodiment can be implemented by being combined as appropriate with any of the above-described embodiments.

(Embodiment 5)

In this embodiment, examples of electronic appliances each including a data processing circuit using a memory device of one embodiment of the present invention are described with reference to FIGS. 12A to 12D.

Figure 12A:
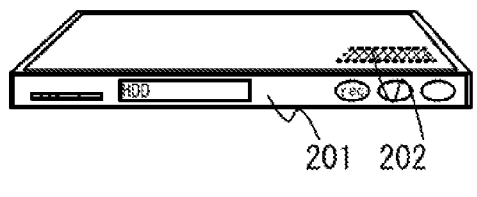
FIGS. 12A to 12D are electronic appliances each including a data processing device.

An electronic appliance illustrated in FIG. 12A is an example of an image recording/reproducing device.

The electronic appliance illustrated in FIG. 12A includes a housing 201 and a data processing circuit 202 provided in the housing 201.

The data processing circuit 202 illustrated in FIG. 12A functions as an MPU, a memory, an image processing circuit, a controller, or the like. The data processing circuit 202 has the structure of the memory device described in Embodiment 1. Thus, the data processing circuit 202 illustrated in FIG. 12A can achieve low power consumption compared to a memory device including a memory element of an MRAM, which has a resistance value varied by supplying current to the memory element.

Figure 12B:
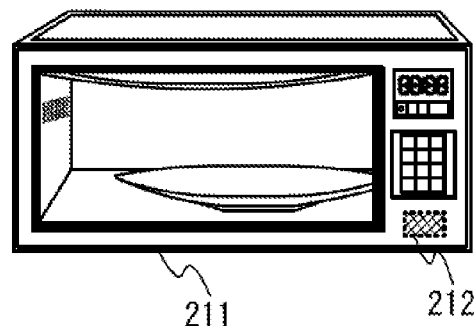

An electronic appliance illustrated in FIG. 12B is an example of a microwave oven.

The electronic appliance illustrated in FIG. 12B includes a housing 211 and a data processing circuit 212 provided in the housing 211.

The data processing circuit 212 illustrated in FIG. 12B functions as an MPU, a memory, or the like. The data processing circuit 212 has the structure of the memory device described in Embodiment 1. Thus, the data processing circuit 212 illustrated in FIG. 12B can achieve low power consumption compared to a memory device including a memory element of an MRAM, which has a resistance value varied by supplying current to the memory element.

Figure 12C:
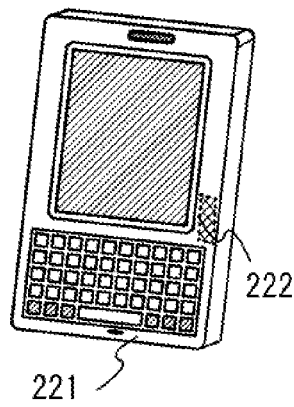

An electronic appliance illustrated in FIG. 12C is an example of a portable information terminal.

The portable information terminal illustrated in FIG. 12C includes a housing 221 and a data processing circuit 222 provided in the housing 221.

The data processing circuit 222 illustrated in FIG. 12C functions as an MPU, a memory, an image processing circuit, a controller, or the like. The data processing circuit 222 has the structure of the memory device described in Embodiment 1. Thus, the data processing circuit 222 illustrated in FIG. 12C can achieve low power consumption compared to a memory device including a memory element of an MRAM, which has a resistance value varied by supplying current to the memory element.

Figure 12D:
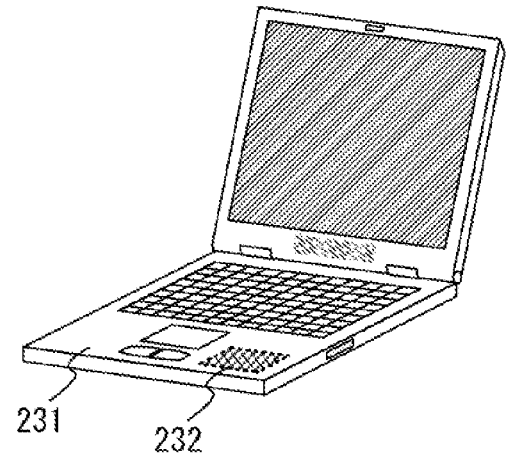

An electronic appliance illustrated in FIG. 12D is an example of a laptop computer.

The laptop computer illustrated in FIG. 12D includes a housing 231 and a data processing circuit 232 provided in the housing 231.

The data processing circuit 232 illustrated in FIG. 12D functions as an MPU, a memory, an image processing circuit, a controller, or the like. The data processing circuit 232 has the structure of the memory device described in Embodiment 1. Thus, the data processing circuit 232 illustrated in FIG. 12D can achieve low power consumption compared to a memory device including a memory element of an MRAM, which has a resistance value varied by supplying current to the memory element.

As described above, the examples of electronic appliances are shown in FIGS. 12A to 12D, and the structure of Embodiment 1 can be applied to any electronic appliance as long as the electronic appliance includes a data processing circuit.

This application is based on Japanese Patent Application serial no. 2012-056282 filed with Japan Patent Office on Mar. 13, 2012, the entire contents of which are hereby incorporated by reference.

What is claimed is:

1. A memory device comprising:
   a volatile memory portion;
   a nonvolatile memory portion being electrically connected to the volatile memory portion, the nonvolatile memory portion comprising a memory element comprising a first terminal and a second terminal;
   a first line being operationally connected to the memory element; and a second line being operationally connected to the memory element, wherein the memory element is configured to store data stored in the volatile memory portion, wherein a resistance value of the memory element is variable in accordance with a voltage applied between the first terminal and the second terminal, wherein the nonvolatile memory portion further comprising:
- a first circuit being configured to switch the voltage applied to the memory element in accordance with the data; and
- a first element being configured to output the data in accordance with the resistance value of the memory element, wherein the first line is configured to transmit a first signal for controlling storage of the data and output of the data to the volatile memory portion, wherein the second line is configured to transmit a second signal for controlling storage of the data and output of the data to the volatile memory portion.

2. The memory device according to claim 1,
wherein the first terminal is an electrode,
wherein the second terminal is an electrode, and
wherein the memory element comprises a transition metal oxide between the first terminal and the second terminal.

3. An electronic device comprising the memory device according to claim 1.

4. A driving method of a memory device comprising:
a volatile memory portion; and
a nonvolatile memory portion being electrically connected to the volatile memory portion, the nonvolatile memory portion comprising a memory element comprising a first terminal and a second terminal,
wherein the memory element is configured to store data stored in the volatile memory portion, and
wherein a resistance value of the memory element is variable in accordance with a voltage applied between the first terminal and the second terminal,
the driving method comprising the steps of:
- storing data stored in the volatile memory portion into the nonvolatile memory portion;
- controlling stop and restart of power supply to the volatile memory portion and the nonvolatile memory portion;
- switching whether a second voltage is applied to the memory element or not by a first signal; and
- switching a polarity of the second voltage applied to the memory element by the data and a second signal.

5. The driving method of a memory device according to claim 4, wherein the storing step is operated by switching the voltage applied to the memory element.

6. The driving method of a memory device according to claim 4, comprising the steps of:
- converting the data stored in the nonvolatile memory portion as the resistance value of the memory element into a first voltage; and
- outputting the first voltage to the volatile memory portion.

7. A data processing device including:
a memory device comprising:
  a volatile memory portion; and
  a nonvolatile memory portion being electrically connected to the volatile memory portion, the nonvolatile memory portion comprising a memory element comprising a first terminal and a second terminal,
an address management portion;
a program memory;
an instruction register;
an instruction decoder;
a control portion;
a register group;
an arithmetic unit; and
an arithmetic register,
wherein the memory element is configured to store data stored in the volatile memory portion,
wherein a resistance value of the memory element is variable in accordance with voltage applied between the first terminal and the second terminal, and
wherein the instruction register, the register group, and the arithmetic register each include the memory device.

8. The memory device according to claim 7,
wherein the first terminal is an electrode,
wherein the second terminal is an electrode, and
wherein the memory element comprises a transition metal oxide between the first terminal and the second terminal.

9. An electronic device comprising the memory device according to claim 7.

10. A memory device comprising:
a volatile memory portion; and
a nonvolatile memory portion being electrically connected to the volatile memory portion, the nonvolatile memory portion comprising:
  a memory element comprising a first terminal and a second terminal;
  a volatile switching circuit electrically connected to the first terminal;
  a first switch directly connected to the first terminal; and
  a second switch directly connected to the second terminal,
wherein the memory element is configured to store data stored in the volatile memory portion, and
wherein a resistance value of the memory element is variable in accordance with voltage applied between the first terminal and the second terminal.

11. The memory device according to claim 10,
wherein the first terminal is an electrode,
wherein the second terminal is an electrode, and
wherein the memory element comprises a transition metal oxide between the first terminal and the second terminal.

12. An electronic device comprising the memory device according to claim 10.

* * * * *